(12) United States Patent
Bianco et al.

(10) Patent No.: US 10,395,868 B2
(45) Date of Patent: Aug. 27, 2019

(54) METHOD FOR DETERMINING THE OPERATING STATUS OF A MV SWITCHING DEVICE OF THE ELECTROMAGNETIC TYPE

(71) Applicant: ABB Schweiz AG, Baden (CH)

(72) Inventors: Andrea Bianco, Sesto San Giovanni (IT); Gabriele Valentino De Natale, Milan (IT); Andrea Ricci, Dalmine (IT); Marco Testa, Dalmine (IT)

(73) Assignee: ABB Schweiz AG, Baden (CH)

( * ) Notice: Subject to any disclaimer, the term of this patent is extended or adjusted under 35 U.S.C. 154(b) by 212 days.

(21) Appl. No.: 15/512,797

(22) PCT Filed: Aug. 5, 2015

(86) PCT No.: PCT/EP2015/068048
§ 371 (c)(1),
(2) Date: Mar. 20, 2017

(87) PCT Pub. No.: WO2016/041691
PCT Pub. Date: Mar. 24, 2016

(65) Prior Publication Data
US 2017/0250042 A1    Aug. 31, 2017

(30) Foreign Application Priority Data
Sep. 19, 2014    (EP) .................................. 14185581

(51) Int. Cl.
*H01F 7/18*    (2006.01)
*H01H 47/00*    (2006.01)
(Continued)

(52) U.S. Cl.
CPC ....... *H01H 47/002* (2013.01); *G01R 31/3274* (2013.01); *H01H 47/02* (2013.01);
(Continued)

(58) Field of Classification Search
CPC ...... H01H 47/002; H01H 47/02; H01H 50/20; H01H 50/44; H01H 50/54; H01F 2007/1855; G01R 31/3274
(Continued)

(56) References Cited

U.S. PATENT DOCUMENTS

2006/0098375 A1*  5/2006  Lluch .................. H01H 47/002
                                                335/2
2007/0222427 A1   9/2007  Takeuchi et al.
(Continued)

FOREIGN PATENT DOCUMENTS

DE    102009021856 A1    11/2010
EP        1811539 A1     7/2007
FR        2835061 A1     7/2003

OTHER PUBLICATIONS

Machine Translation of Bataille et al. French Patent Document FR 2835061 A1, Jul. 25, 2003 (Year: 2003).*
(Continued)

*Primary Examiner* — Kevin J Comber
(74) *Attorney, Agent, or Firm* — Taft Stettinius & Hollister LLP; J. Bruce Schelkopf (57) ABSTRACT

A method for determining the operating status of a MV switching device is provided. The method includes providing a test signal to said test coil for an observation period of time. Measuring data is obtained which is indicative of the voltage at the terminals of the test coil and of the current circulating along the test coil during the observation period of time. Observation data is calculated which is indicative of the electric behavior of the test coil at the end of said observation period of time. A transformation function is selected which is indicative of the electromagnetic behavior of the electromagnetic actuator. First estimation data is calculated which is indicative of the operating status of the electromagnetic actuator.

13 Claims, 8 Drawing Sheets

(51) Int. Cl.
  *H01H 47/02* (2006.01)
  *H01H 50/20* (2006.01)
  *H01H 50/44* (2006.01)
  *H01H 50/54* (2006.01)
  *G01R 31/327* (2006.01)
(52) U.S. Cl.
  CPC ............ *H01H 50/20* (2013.01); *H01H 50/44* (2013.01); *H01H 50/54* (2013.01); *H01F 2007/1855* (2013.01)
(58) Field of Classification Search
  USPC .......................................................... 361/170
  See application file for complete search history.

(56) References Cited

U.S. PATENT DOCUMENTS

2008/0222427 A1   9/2008   Baentsch et al.
2013/0335174 A1   12/2013  Kodama et al.

OTHER PUBLICATIONS

European Patent Office, International Search Report and Written Opinion, corresponding application PCT/EP15/68048, dated Oct. 16, 2015, 11 pages.
European Patent Office, European Search Report and Search Opinion, corresponding application 14185581.7, dated Mar. 3, 2015, 8 pages.
State Intellectual Property Office of the P.R. of China, First Office Action and Search Report for corresponding application No. CN201580050131.3, dated Jun. 4, 2018, 15 pages.

\* cited by examiner

METHOD FOR DETERMINING THE OPERATING STATUS OF A MV SWITCHING DEVICE OF THE ELECTROMAGNETIC TYPE

The present invention relates to the field of switching devices for medium voltage applications, such as circuit breakers, contactors, disconnectors, reclosers or the like. For the purposes of the present invention, the term medium voltage (MV) identifies voltages higher than 1 kV AC and 1.5 kV DC and lower than 72 kV AC and 100 kV DC. More particularly, the present invention relates to a method for determining the operating status of a MV switching device of electromagnetic type, in particular of the electromagnetic actuator thereof.

As it is known, a MV switching device of the electromagnetic type comprises an electromagnetic actuator for coupling or uncoupling its electric contacts during switching operations.

Generally, the electromagnetic actuator comprises a magnetic core provided with an excitation coil operatively associated to a movable plunger mechanically coupled to the mobile contacts of the switching device.

Typically, during a switching operation, suitably arranged power supply means provide an excitation current to the excitation coil.

The magnetic field, which is induced by the excitation current circulating in the excitation coil, generates a force that operates the movable plunger.

Typically, this latter can be reversibly moved between two stable operative positions, each corresponding to a coupling or uncoupling position of the electric contacts and, therefore, to a closing and opening status of the switching device.

As is known, the actual travelling law of the electromagnetic actuator (in particular of the movable plunger) during switching operations affects the breaking capabilities of the switching device.

For these reasons, the control unit, which controls the switching operations of the switching device, generally needs to obtain data related to the actual position of the movable plunger of the electromagnetic actuator.

In some switching devices of known type, proximity sensors (such as magnetic sensors) are adopted for transmitting sensing signals indicative of the position of the movable plunger to the control unit.

Available proximity sensors capable of providing satisfactory performances in terms of sensing speed are generally quite expensive. Further, cabling of these sensors is needed, which further increases the overall size of the electromagnetic actuator and increases the related industrial costs.

In other switching devices of known type, micro-switches are adopted to sense the position of the movable plunger. This solution shows drawbacks in term of sensing reliability and entails high industrial costs as well.

In the state of the art, it is thus still felt the need for technical solutions that are capable of overcoming the technical issues described above.

In order to respond to this need, the present invention provides a method for determining the operating status of a switching device, according to the following claim 1 and the related dependent claims.

In a further aspect, the present invention provides a method for controlling a switching device, according to the following claim 7.

In yet a further aspect, the present invention relates to a switching device according to the following claim 8 and the related dependent claims.

The method, according to the invention, provides advanced estimation data indicative of the operating status of the electromagnetic actuator of the switching device.

Said diagnostic information can be used to determine the actual position of the movable plunger of the electromagnetic actuator in a sensorless manner, e.g. without the arrangement of dedicated position sensors.

Information related to the actual travelling law of the movable contacts of the switching device can thus be easily acquired during switching operations.

The diagnostic information provided by the method according to the invention can be further used to determine the presence of possible problems in the electromagnetic actuator. As an example, it can be used to identify efficiency losses due to short circuits of a relevant number of windings of the excitation coil of the electromagnetic actuator.

The method, according to the invention, provides relevant advantages in managing the operating life of an electromagnetically actuated switching device without the provision of dedicated cumbersome and expensive sensing arrangements.

Further characteristics and advantages of the method, according to the present invention, will become more apparent from the detailed description of preferred embodiments illustrated only by way of non-limitative example in the accompanying drawings, in which:

Referring to the cited figures, the present invention is related to a method 100 for determining the operating status of a MV switching device 1.

In a further aspect, the invention relates to a method for controlling a MV switching device that comprises at least a step of executing the method 100.

In yet a further aspect, the invention relates to a MV switching device 1 comprising control means 14 capable of implementing the method 100.

The MV switching device 1 comprises one or more electric poles, each of which comprises a movable contact 11 and a fixed contact 12, which are electrically connected to a conductor (e.g. a phase conductor) of a power distribution line (not shown).

The movable contact 11 and the fixed contact 12 are adapted to be coupled or uncoupled respectively during the switching operations of the switching device 1.

A switching operation may be a closing operation, in which the contacts 11, 12 are brought from an uncoupled state to a coupled state, or an opening operation, in which the contacts 11 and 12 are brought from a coupled state to an uncoupled state.

When the contacts 11, 12 are in a coupled or uncoupled state, the switching device 1 is respectively in a closing or an opening condition.

The switching device 1 comprises an electromagnetic actuator 13 that comprises a magnetic core 131, a main excitation coil 132 and a movable plunger 133 that is operatively coupled to each movable contact 11 of each electric pole through a kinematic chain (not shown).

During a switching operation of the switching device, an excitation current $I_E$ circulates in the excitation coil 132 in order to generate a magnetic flux.

Advantageously, the excitation coil 132 is wound around the magnetic core 131 that properly directs the streamlines of the magnetic flux generated by the excitation current $I_E$.

The movable plunger 133 is operated by a force generated by the magnetic flux enchained with the magnetic core 131 and the movable plunger 133.

During a switching operation of the switching device 1, the movable plunger 133 is operated between two positions, which correspond to a coupled state or uncoupled state of the electric contacts 11, 12 and, therefore, to a closing or opening condition of the switching device 1.

One or more permanent magnets (not shown) may be arranged in the proximity of the magnetic core to generate a permanent magnetic force that is always directed at steadily maintaining the movable plunger 133 in the position reached at the end of its run, when a switching operation is carried out.

Preferably, the switching device 1 comprises power supply means 17 that supply the excitation current $I_E$ to the excitation coil 132 during a switching operation.

According to the invention, the electromagnetic actuator comprises a test coil 132, 134 wound around the magnetic core 131.

Preferably, such a test coil is the main excitation coil 132 of the electromagnetic actuator 13.

Figure 1:
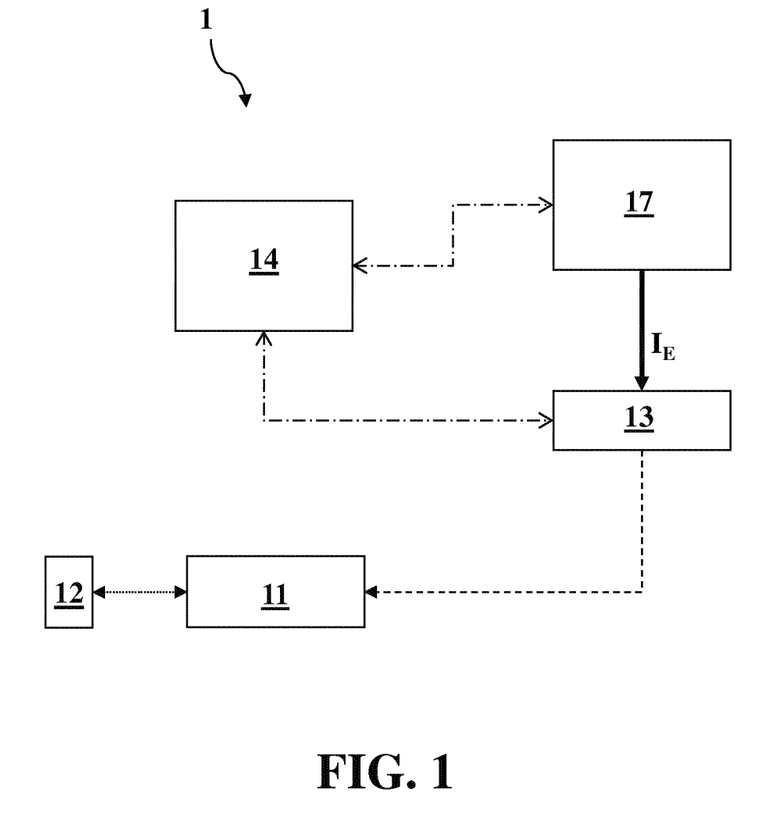
FIGS. 1-5 are block diagrams that schematically show some embodiments of the switching device according to an aspect of the invention.
Figure 2:
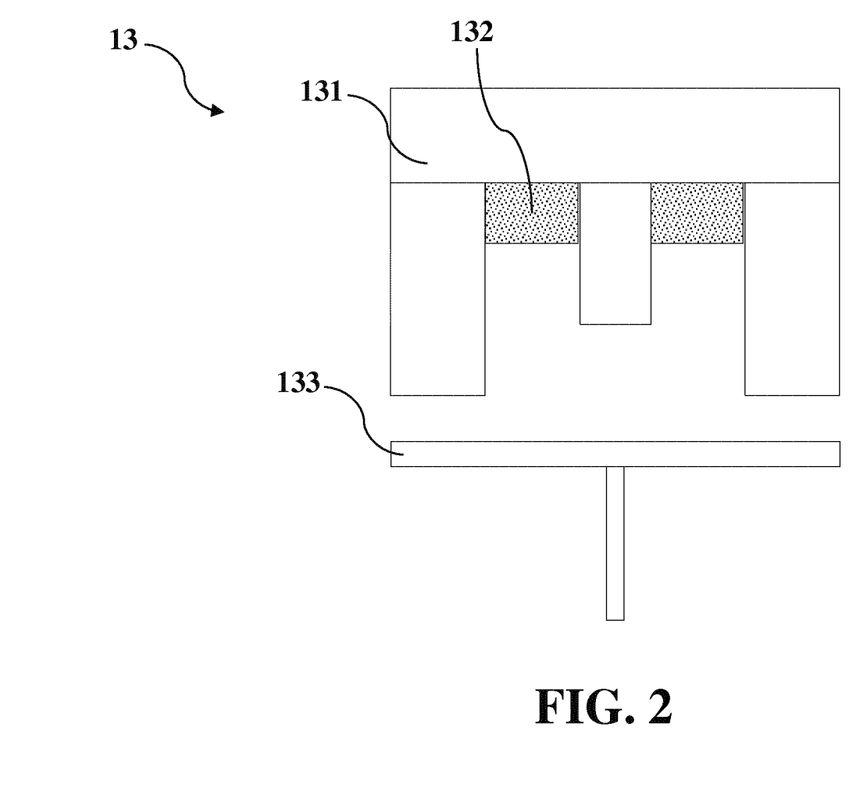
Figure 3:
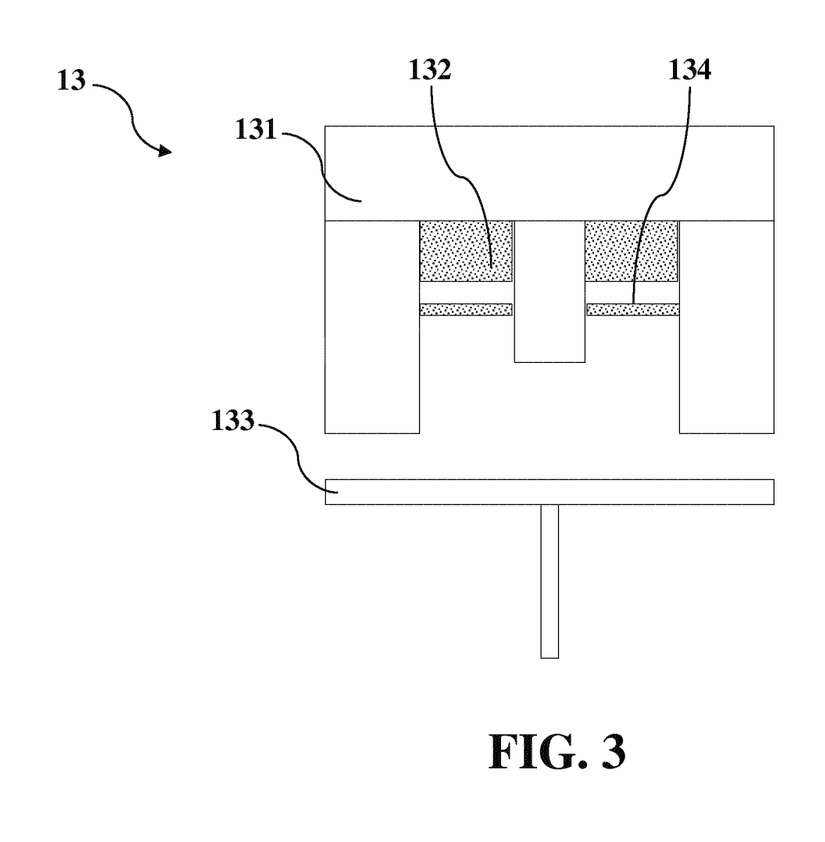
Figure 4:
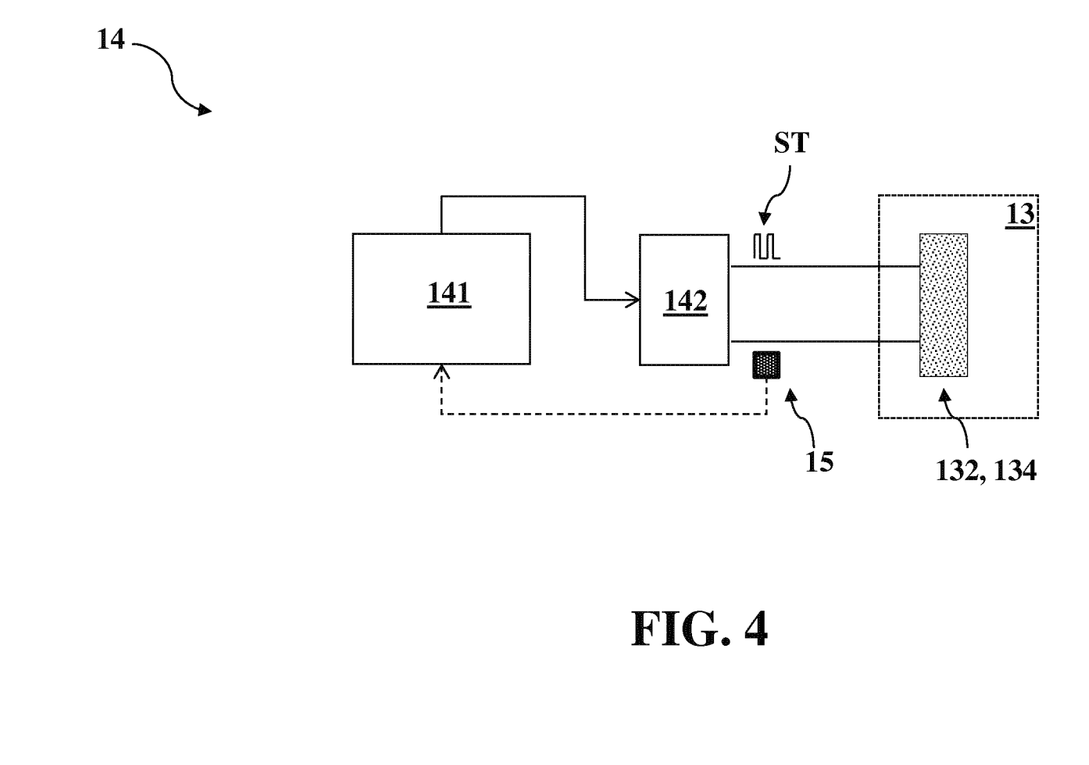
Figure 5:
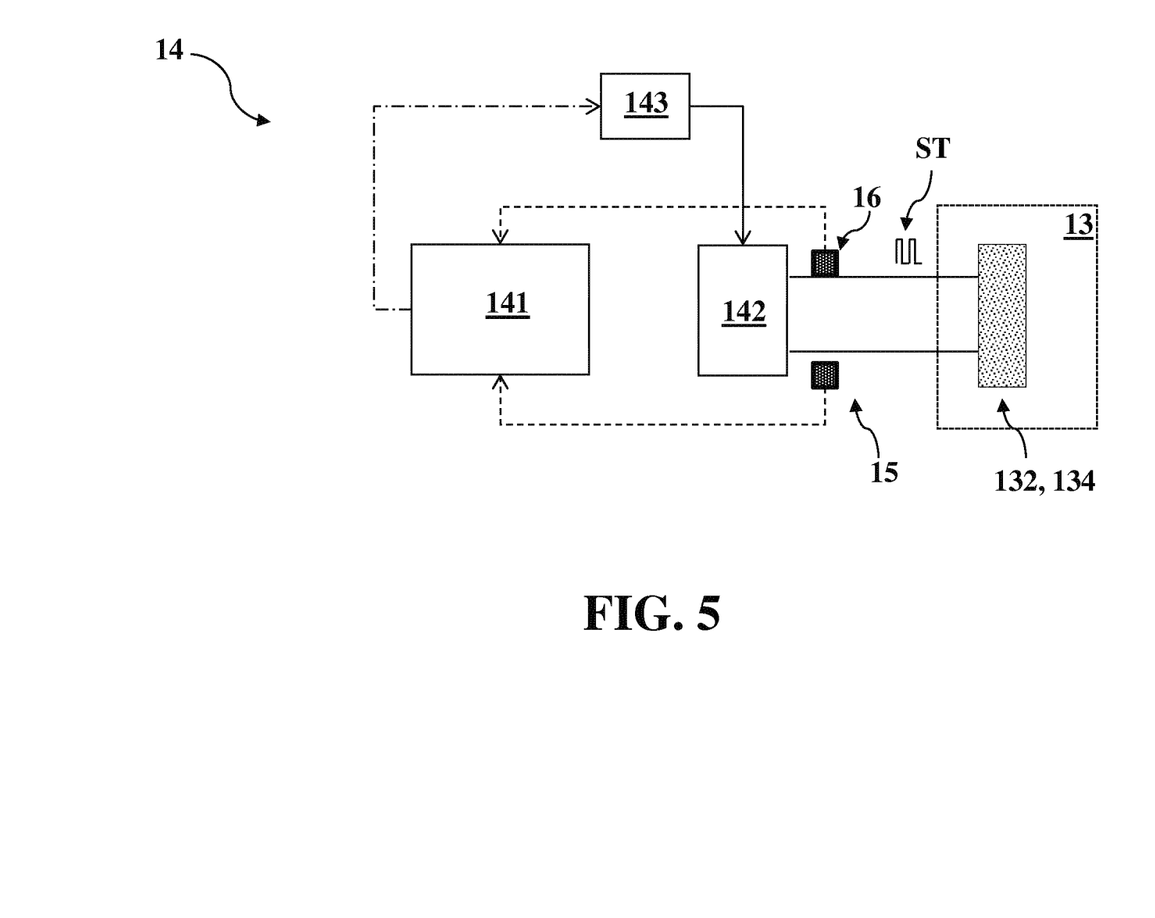
Figure 6:
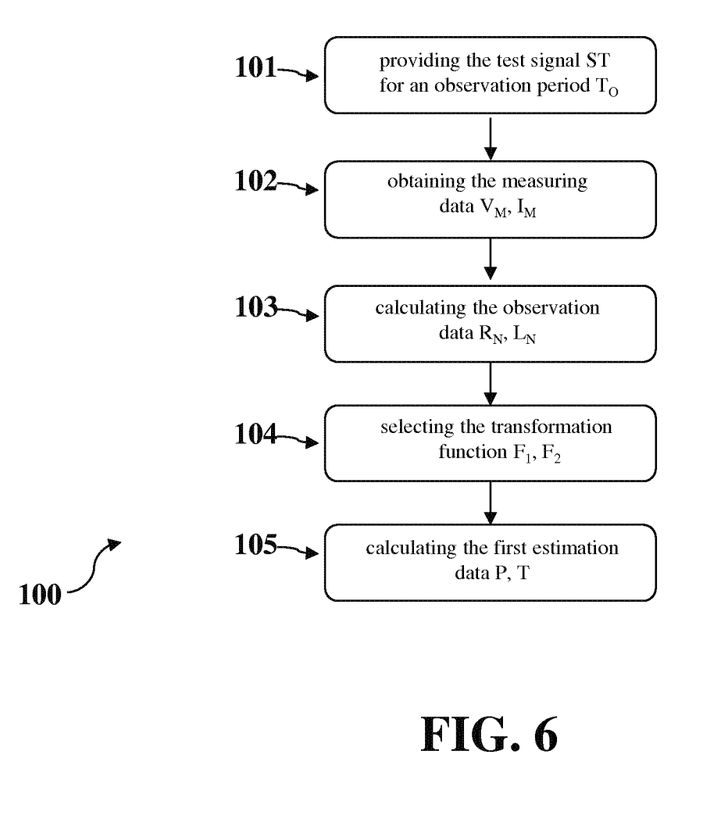
FIGS. 6-8 are block diagrams that schematically show an embodiment of the method, according to the present invention.
Figure 7:
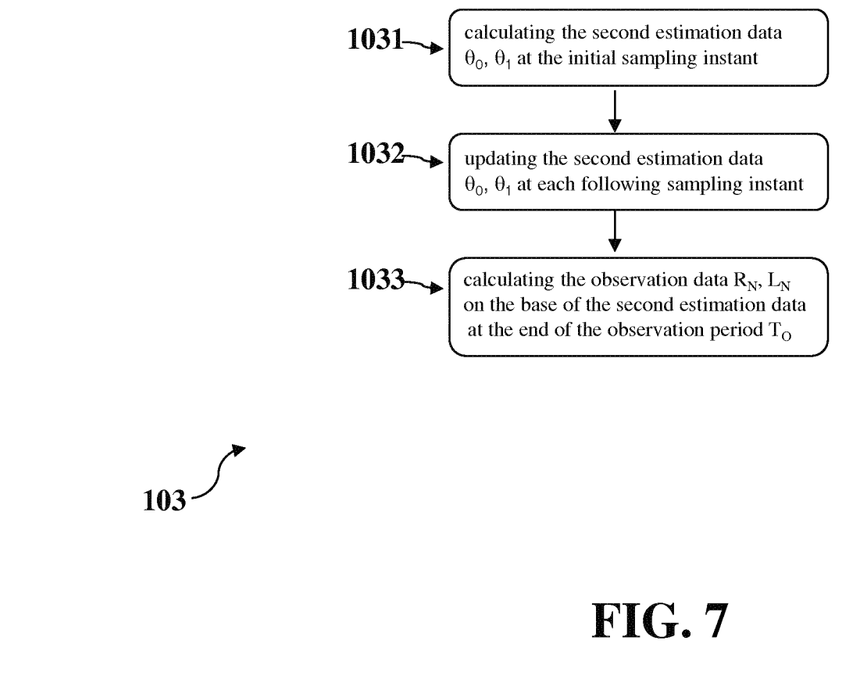
Figure 8:
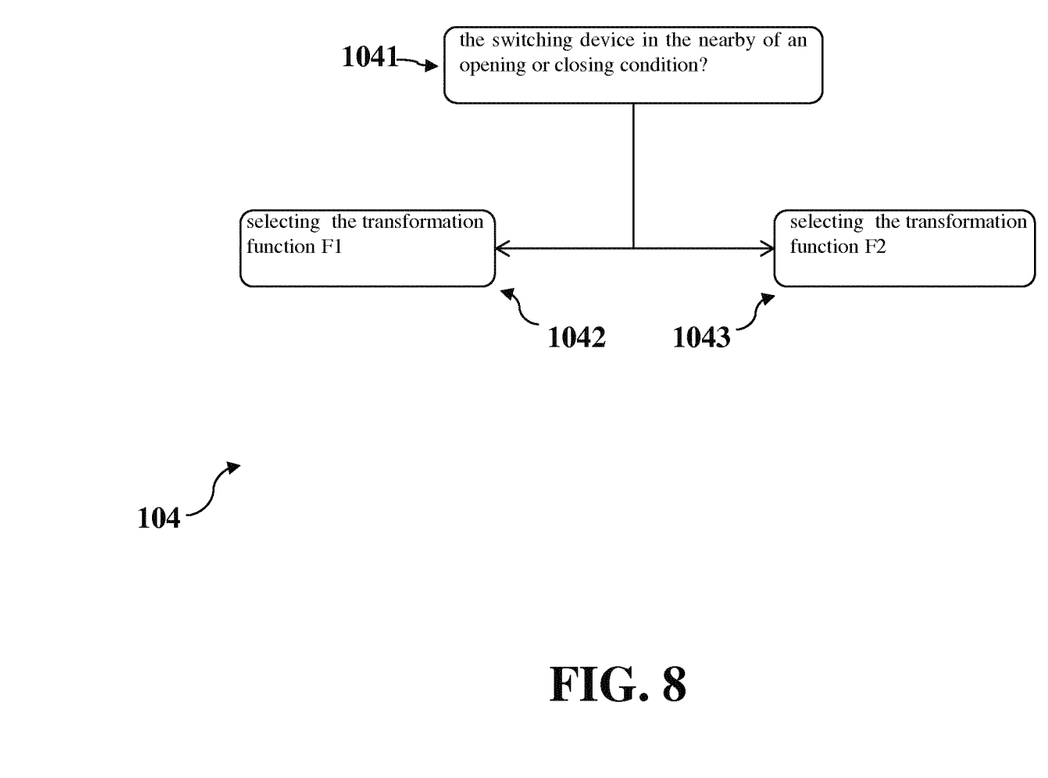

In alternative embodiments of the present invention, such a test coil is formed by an additional excitation coil 134 (different from the main excitation coil 132), which is wound around the magnetic core 131 to generate a magnetic flux when a current signal or a voltage signal is applied at its terminals (FIG. 3).

The switching device 1 comprises control means 14 for controlling the operations of the switching device 1.

As an example, when a switching operation (i.e. a closing or an opening operation) has to be executed, the control means 14 send control signals to the power supply means 17 to command these latter to supply the test current $I_E$ to the main excitation coil 132.

Preferably, the control means 14 comprises a computerized unit 141 (such as a microprocessor) adapted to execute proper software instructions to generate command/data signals to manage the operating life of the switching device 1.

Preferably, the control means 14 comprise a driving circuit 142 electrically connected to the test coil 132 or 134 to provide one or more test signals ST.

For the sake of clarity, it is evidenced that the test signals ST are different from the excitation current $I_E$ provided to the excitation coil 132 to operate the movable plunger 133 during a switching operation of the switching devices 1.

The test signals ST are electric signals (voltage or current signals) having a very small magnitude (amplitude or intensity) and a completely different waveform with respect to the excitation current $I_E$.

Preferably, the driving circuit 142 is directly controlled by the computerized unit 141.

As an alternative, the driving circuit 142 may be controlled by a dedicated control circuit 143 that is in turn controlled by the computerized unit 141.

The method 100, according to the invention, comprises the following steps:

the step 101 of providing a test signal ST to the test coil 132, 134 for an observation period of time $T_O$;

the step 102 of obtaining measuring data $V_M$, $I_M$ indicative of the voltage at the terminals of the test coil 132, 134 and indicative of the current circulating along the test coil 132, 134 during the observation period $T_O$;

the step 103 of determining observation data $R_N$, $L_N$ indicative of the electric behaviour of the test coil 132, 134 at the end of the observation period $T_O$ basing on the measuring data $V_M$, $I_M$;

the step 104 of selecting a predetermined transformation function $F_1$, $F_2$ indicative of the electromagnetic behaviour of the electromagnetic actuator 13;

the step 105 of calculating first estimation data P, T indicative of the operating status of the electromagnetic actuator on the base of the observation data $R_N$, $L_N$ by using the transformation function $F_1$, $F_2$.

According to the invention, the first estimation data comprise a first estimation value P indicative of the position of the movable plunger 133 of the electromagnetic actuator 13.

Preferably, the first estimation data comprise also a second estimation value T indicative of the temperature of the electromagnetic actuator 13.

Referring to the step 101 of the method 100, the test signal ST advantageously has a waveform capable of exciting the magnetic core 131 of the electromagnetic actuator 13 to generate a magnetic flux.

Preferably, the test signal ST is a signal having a pulsed waveform. In this case, the frequency, duty-cycle and amplitude of the pulses of the test signal ST are advantageously selected on the base of the magnetic characteristics of the magnetic core 131.

Preferably, the test signal ST is a voltage signal that is applied at the terminals of the test coil 132, 134 and that determines the circulation of a current along this latter.

The test coil 132, 134 is constantly fed with the test signal ST during the observation period of time $T_O$, which may be, as an example, of 20 ms.

In the practical implementation of the step 101 of the method 100, the control means 14 are configured to provide the test signal ST. In particular, the computerised unit 141 is adapted to execute software instructions to provide control signals to the driving circuit 142 or the dedicated control circuit 143 to send the test signal ST to the test coil 132, 134.

Referring now to the step 102 of the method 100, the switching device 1 comprises sensing means 15, 16 to acquire the measuring data $V_M$, $I_M$.

Such sensing means may comprise a current sensor 15 and/or a voltage sensor 16 configured to provide suitable sensing signals to the computerized unit 141. The sensing signals provided by the current and voltage sensors 15, 16 are respectively indicative the current circulating in the test coil 132, 134 and of the voltage applied at the terminals of the test coil 132, 134.

In some embodiments of the invention, such sensing means may merely comprise the current sensor 15 or the voltage sensor 16, according to the needs. This may occur when data related to the amplitude or intensity of the applied voltage or current test signal are already available to the computerized unit 141.

In other embodiments of the invention, the mentioned sensing means may comprise both the current and voltage sensors 15, 16.

In the practical implementation of the step 102 of the method 100, the control means 14 are adapted to receive the sensing signals transmitted by the sensing means 15, 16 and obtain the measuring data $V_M$, $I_M$. In particular, said measuring data are obtained by the computerised unit 141 that execute suitable software instructions to process the sensing signals received from the sensing means 15, 16.

Preferably, in a digital implementation of the method 100, the measuring data $V_M$, $I_M$ are obtained at a plurality of subsequent sampling instants comprised in the observation period $T_O$, which have a sampling period $T_S$ (e.g. 0.1 ms) set by the computerised unit 141.

Referring now to the step 103 of the method 100, the observation data $R_N$, $L_N$ advantageously comprise multiple different observation parameters indicative of the electrical behaviour of the test coil 132, 134 at the end of the observation period $T_O$.

It is evidenced that the observation data $R_N$, $L_N$ relate to the electric behaviour of the test coil 132, 134 at the observation period $T_O$, i.e. after said observation parameters have reached stable convergence values during a stimulation process of the test coil 132, 134 by means of the test signal ST.

Preferably, such observation parameters comprise a first observation value $R_N$ and a second observation value $L_N$ that are respectively indicative of the resistance and of the inductance of the test coil 132, 134 at the end of the observation period $T_O$.

As mentioned above, the observation data $R_N$, $L_N$ are calculated on the base of measuring data $V_M$, $I_M$ indicative of the voltage at the terminals of the test coil 132, 134 and of the current circulating along the test coil 132, 134 during the observation period $T_O$, in particular at the sampling instants set by the computerised unit 141.

Preferably, the step 103 of the method 100 comprise a recursive calculation procedure that comprises the step 1031 of calculating second estimation data $\theta_0$, $\theta_1$ indicative the electric behaviour of the test coil 132, 134 at an initial sampling instant comprised in the observation period $T_O$. Said estimation data $\theta_0$, $\theta_1$ are calculated on the base of the measuring data $V_M$, $I_M$ obtained at said initial sampling instant.

The procedure 103 comprises the step 1032 of updating the estimation data $\theta_0$, $\theta_1$ at each subsequent sampling instant following the initial sampling instant up to the end of the observation period $T_O$. The estimation data $\theta_0$, $\theta_1$ are, time by time, updated on the base of the measuring data $V_M$, $I_M$ obtained at each corresponding sampling instant subsequent to the initial sampling instant.

The procedure 103 comprises the step 1033 of calculating the observation data $R_N$, $L_N$, which are indicative of the electric behaviour of the test coil 132, 134 at the end of the observation period of time $T_O$, on the base of the estimation data $\theta_0$, $\theta_1$ calculated for the last sampling instant comprised in the observation period $T_O$.

In an exemplary embodiment of the present invention, the recursive calculation procedure 103 is advantageously based on the following discrete second order mathematical model of the test coil 132, 134:

$$I_M(t) = \left[1 - R\frac{T_s}{L}\right] \cdot I_M(t-1) + \frac{T_s}{L} V_M(t-1)$$

where $V_M$, $I_M$ are the measuring data, R is the resistance of the test coil 132, 134, L is the inductance of the test coil 132, 134, $T_S$ is the sampling period and t, t−1 are subsequent generic sampling instants.

Such a mathematical model can be updated from a sampling instant t-1 to another on the base of the following updating equation:

$$y(t) = \phi(t-1)^T \hat{\theta}(t) \text{ where}$$

$$y(t) = \begin{bmatrix} I_M(t) \\ V_M(t) \end{bmatrix}$$

is the vector of measuring data referring to the sampling instant t, $$\phi(t-1) = \begin{bmatrix} I_M(t-1) \\ V_M(t-1) \end{bmatrix}$$

is a regression vector at the preceding sampling instant t−1 and $\hat{\theta}(t)=$ $$\begin{bmatrix} \theta_0(t) \\ \theta_1(t) \end{bmatrix} = \begin{bmatrix} 1 - R\frac{T_s}{L}(t) \\ \frac{T_s}{L}(t) \end{bmatrix}$$

is the unknown vector of second estimation data at the sampling instant t. In order to update the second estimation data $\theta_0$, $\theta_1$ at each sampling instant up to the end of the observation period $T_O$, the following mathematical equations can be used:

$$\hat{\theta}(t) = \hat{\theta}(t-1) + \frac{P(t-2)\phi(t-1)}{1 + \phi(t-1)^T P(t-2)\phi(t-1)} \left[y(t) - \phi(t-1)^T \hat{\theta}(t-1)\right]$$

$$P(t-1) = P(t-2) + \frac{P(t-2)\phi(t-1)\phi(t-1)^T P(t-2)}{1 + \phi(t-1)^T P(t-2)\phi(t-1)}$$

where P(t−1), P(t −2) are values of the gain matrix evaluated at the sampling instants t−1 and t−2 that precede the sampling instant t, respectively.

Once the vector of second estimation data $$\hat{\theta} = \begin{bmatrix} \theta_0 \\ \theta_1 \end{bmatrix}$$

at the end of the observation period $T_O$ (i.e. at the last sampling instant comprised in the observation period $T_O$) has been calculated, the observation data $R_N$, $L_N$ may be advantageously given by the following equations:

$$R_N = \frac{1 - \theta_0}{\theta_1}, L_N = \frac{T_s}{\theta_1}$$

In the practical implementation of the step 103 of the method 100, the control means 14 are configured to calculate the observation data $R_N$, $L_N$. In particular, the computerised unit 141 is capable of executing suitable software instructions to implement the calculation steps (such those described above) necessary to calculate the observation data $R_N$, $L_N$.

Referring now to the step 104 of the method 100, the transformation function $F_1$, $F_2$ may be formed by a set of mathematical equations or calculation tables that are pre-defined in consideration of the physical characteristics describing the behaviour of the electromagnetic actuator 13.

Preferably, the step 104 of selecting said transformation function comprises the step 1041 of determining whether the switching device 1 is in the nearby of a closing condition or in the nearby of an opening condition basing on the observation data $R_N$, $L_N$.

Then, the step 104 comprises the step 1042 of selecting a first transformation function $F_1$, if the switching device 1 is determined to be in the nearby of a closing condition, or the step 1043 of selecting a second transformation function $F_2$, if said switching device 1 is determined to be in the nearby of an opening condition.

This solution is quite advantageous in the embodiments in which the electromagnetic actuator 13 is subject to changes depending on whether it is in the nearby of a given operating condition.

By comparing the observation data $R_N$, $L_N$ with predefined comparison tables, it is possible to roughly determining the operating region of the switching device 1, even if the exact position of the movable plunger 133 of the electromagnetic actuator 1 cannot be determined yet.

Basing on the roughly determined operating region, it is possible to select the transformation function, which most properly describes the behaviour of the electromagnetic actuator 13 in such an operating condition.

In the practical implementation of the step 104 of the method 100, the control means 14 are configured to operate the selection of the transformation function $F_1$, $F_2$.

Preferably, the transformation function $F_1$, $F_2$ is stored in a memory of the computerised unit 141.

Preferably, the computerised unit 141 is capable of executing software instructions to compare the calculated observation data $R_N$, $L_N$ with predefined comparison tables stored in a memory and select the most appropriate transformation function $F_1$, $F_2$ basing on the results of such a comparison process.

Referring now to the step 105 of the method 100, the first estimation data P, T may be calculated of the base of the following equation:

$$\begin{bmatrix} P \\ T \end{bmatrix} = F \cdot \begin{bmatrix} R_N \\ L_N \end{bmatrix}$$

where F is the transformation function that has been selected at the previous step 104 of the method 100, e.g. the transformation function $F_1$ or $F_2$.

In the practical implementation of the step 105 of the method 100, the control means 14 are configured to calculate the first estimation data P, T. In particular, the computerised unit 141 is capable to execute suitable software instructions to calculate the first estimation data P, T.

The method 100, according to the present invention, provides remarkable advantages with respect to the solutions of the state of the art.

The method 100 provides a precise estimation of the actual operating position of the movable plunger 133 and, possibly, of the temperature of the electromagnetic actuator.

This is basically possible thanks to the fact that, when it is fed with a suitable test signals ST, the test coil 132, 134 shows large variations of its characteristics parameters (such as resistance and inductance), when the switching device 1 changes its operating condition.

The calculated observation data $R_N$, $L_N$, which advantageously comprise a plurality of characteristic parameters describing the behavior of the test coil 132, 134, can thus be effectively used to determine the actual operating status of the electromagnetic actuator 13 and, consequently, of the switching device 1.

The method 100 is particularly suitable for use in a method for controlling the switching device 1, when obtaining of data indicative of the actual operating condition of the electromagnetic actuator 13 is needed.

The method 100 can be easily implemented in practice and it requires relative small calculation resources for being carried out by a processing unit.

The method 100 allows obtaining a sensorless estimation of the operating status of the electromagnetic actuator 13.

This allows reducing the overall size and production costs of the switching device 1 with respect to corresponding solutions of the state of the art, since the arrangement of dedicated position sensors and the related cabling are no more needed.

The invention claimed is:

1. A method for determining the operating status of a MV switching device comprising one or more electric poles, each comprising a movable contact and a fixed contact adapted to be coupled or uncoupled during the switching operations of said switching device and an electromagnetic actuator comprising a magnetic core, a test coil wound around said magnetic core and a movable plunger operatively coupled to the movable contacts of the electric poles the method comprising:

providing a test signal (ST) to said test coil for an observation period of time ($T_O$), said test signal having a waveform capable of exciting said magnetic core;

obtaining measuring data ($V_M$, $I_M$) indicative of a voltage at the terminals of said test coil and indicative of a current circulating along said test coil during said observation period of time, said measuring data being obtained at a plurality of subsequent sampling instants within said observation period;

calculating observation data ($R_N$, $L_N$) indicative of the electric behaviour of said test coil at the end of said observation period of time on the base of said measuring data, said step of calculating said observation data ($R_N$, $L_N$) comprising:

calculating second estimation data ($\theta_0$, $\theta_1$) indicative of the electric behaviour of said test coil at an initial sampling instant within said observation period of time ($T_O$), said second estimation data being calculated based on the measuring data ($V_M$, $I_M$) obtained at said initial sampling instant;

updating said second estimation data ($\theta_0$, $\theta_1$) at each subsequent sampling instant following said initial sampling instant up to the end of said observation period of time ($T_O$), said second estimation data being calculated based on the measuring data obtained at said subsequent sampling instants;

calculating said observation data ($R_N$, $L_N$) based on the second estimation data ($\theta_0$, $\theta_1$) calculated for the last sampling instant within said observation period of time ($T_O$);

selecting at least a transformation function ($F_1$, $F_2$) indicative of the electromagnetic behaviour of said electromagnetic actuator;

calculating first estimation data (P, T) indicative of the operating status of said electromagnetic actuator on the base of said observation data ($R_N$, $L_N$) by using said transformation function, said first estimation data comprising a first estimation value (P) indicative of the position of the movable plunger of said electromagnetic actuator.

2. The method, according to claim 1, wherein said estimation data comprise a second estimation value (T) indicative of the temperature of said electromagnetic actuator.

3. The method according to claim 2, wherein said step of selecting said transformation function comprises the following steps:
  determining whether said switching device is in the nearby of a closing condition or in the nearby of an opening condition basing on said observation data;
  selecting a first transformation function ($F_1$), if said switching device is determined to be in the nearby of a closing condition;
  selecting a second transformation function ($F_2$), if said switching device is determined to be in the nearby of an opening condition.

4. The method according to claim 1, wherein said step of selecting said transformation function comprises the following steps:
  determining whether said switching device is in the nearby of a closing condition or in the nearby of an opening condition basing on said observation data;
  selecting a first transformation function ($F_1$), if said switching device is determined to be in the nearby of a closing condition;
  selecting a second transformation function ($F_2$), if said switching device is determined to be in the nearby of an opening condition.

5. The method according to claim 1, wherein said test signal (ST) is a pulsed voltage signal.

6. The method according to claim 1, wherein said test coil is an excitation coil of said electromagnetic actuator, an excitation current ($I_E$) for operating said movable plunger flowing along said excitation coil during the switching operations of said switching device.

7. A MV switching device comprising:
  one or more electric poles, each comprising a movable contact and a fixed contact adapted to be coupled or uncoupled during switching operation of said switching device;
  an electromagnetic actuator comprising a magnetic core, at least a test coil wound around said magnetic core and a movable plunger operatively coupled to the movable contacts of the electric poles;
  control means for controlling the switching operations of said switching device; said control means configured to:
    provide a test signal (ST) to said test coil for an observation period of time ($T_O$), said test signal having a waveform capable of exciting said magnetic core;
    obtain measuring data ($V_M$, $I_M$) indicative of a voltage at the terminals of said test coil and indicative of a current circulating along said test coil during said observation period of time, said measuring data being obtained at a plurality of subsequent sampling instants within said observation period;
    calculate observation data ($R_N$, $L_N$) indicative of the electric behaviour of said test coil at the end of said observation period of time on the base of said measuring data, said control means being configured to calculate said observation data (RN, LN) by:
      calculating second estimation data ($\theta_0$, $\theta_1$) indicative of the electric behaviour of said test coil at an initial sampling instant within said observation period of time ($T_O$), said second estimation data being calculated based on the measuring data ($V_M$, $I_M$) obtained at said initial sampling instant;
      updating said second estimation data ($\theta_0$, $\theta_1$) at each subsequent sampling instant following said initial sampling instant up to the end of said observation period of time ($T_O$), said second estimation data being calculated based on the measuring data obtained at said subsequent sampling instants;
      calculating said observation data ($R_N$, $L_N$) based on the second estimation data ($\theta_0$, $\theta_1$) calculated for the last sampling instant within said observation period of time ($T_O$);
    select at least a transformation function ($F_1$, $F_2$) indicative of the electromagnetic behaviour of said electromagnetic actuator;
    calculate first estimation data (P, T) indicative of the operating status of said electromagnetic actuator on the base of said observation data ($R_N$, $L_N$) by using said transformation function, said first estimation data comprising a first estimation value (P) indicative of the position of the movable plunger of said electromagnetic actuator.

8. The switching device, according to claim 7, wherein said first estimation data comprise a second estimation value (T) indicative of the temperature of said electromagnetic actuator.

9. The switching device according to claim 8, wherein said control means are configured to select said transformation function by:
  determining whether said switching device is in the nearby of a closing condition or in the nearby of an opening condition basing on said observation data;
  selecting a first transformation function ($F_1$), if said switching device is determined to be in the nearby of a closing condition;
  selecting a second transformation function ($F_2$), if said switching device is determined to be in the nearby of an opening condition.

10. The switching device according to claim 8, wherein said test signal (ST) is a pulsed voltage signal.

11. The switching device according to claim 7, wherein said control means are configured to select said transformation function by:
  determining whether said switching device is in the nearby of a closing condition or in the nearby of an opening condition basing on said observation data;
  selecting a first transformation function ($F_1$), if said switching device is determined to be in the nearby of a closing condition;
  selecting a second transformation function ($F_2$), if said switching device is determined to be in the nearby of an opening condition.

12. The switching device according to claim 7, wherein said test signal (ST) is a pulsed voltage signal.

13. The switching device according to claim 7, wherein said test coil is an excitation coil of said electromagnetic actuator, an excitation current ($I_E$) for operating said movable plunger flowing along said excitation coil during the switching operation of said switching device.

* * * * *